(12) United States Patent
Watanobe et al.

(10) Patent No.: US 7,535,036 B2
(45) Date of Patent: May 19, 2009

(54) SEMICONDUCTOR DEVICE AND METHOD OF MANUFACTURING THE SAME

(75) Inventors: Hisashi Watanobe, Mie (JP); Tooru Hara, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 499 days.

(21) Appl. No.: 11/391,319

(22) Filed: Mar. 29, 2006

(65) Prior Publication Data

US 2006/0220103 A1 Oct. 5, 2006

(30) Foreign Application Priority Data

Mar. 30, 2005 (JP) ............................. 2005-099583

(51) Int. Cl.
*H01L 21/82* (2006.01)
(52) U.S. Cl. ........................ 257/208; 257/211
(58) Field of Classification Search ................. 257/208, 257/211
See application file for complete search history.

(56) References Cited

U.S. PATENT DOCUMENTS 6,541,333 B2 * 4/2003 Shukuri et al. .............. 438/243
7,153,727 B2 * 12/2006 Lee et al. .................... 438/128

FOREIGN PATENT DOCUMENTS

JP 6-310612 11/1994

* cited by examiner

*Primary Examiner*—Douglas M Menz
(74) *Attorney, Agent, or Firm*—Oblon, Spivak, McClelland, Maier & Neustadt, P.C.

(57) ABSTRACT

A semiconductor device includes a semiconductor substrate divided into a memory cell region in which a memory cell is formed and a peripheral circuit region in which a peripheral circuit for driving the memory cell is formed, a plurality of conductive layers provided in each region so as to interpose an interlayer insulating film, a plurality of connection wiring layers formed in a plurality of holes which are formed in the interlayer insulating film so as to extend through the conductive layers of each region, the connection wiring layers electrically connecting the conductive layers, and a spacer insulating film functioning as a spacer which is formed on inner sidewall surfaces of the holes and outer sidewall surfaces of the connection wiring layers in each region.

8 Claims, 14 Drawing Sheets

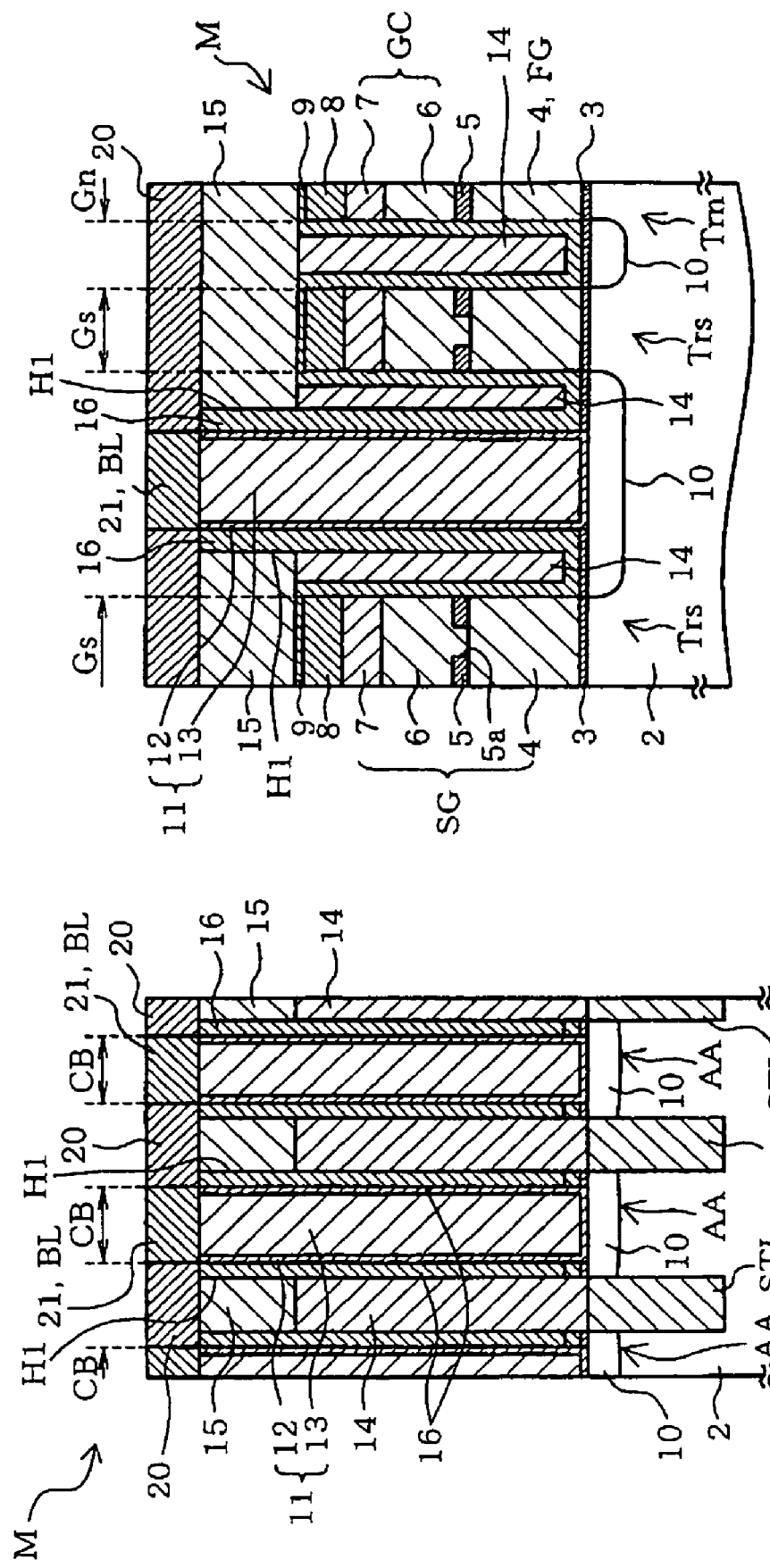

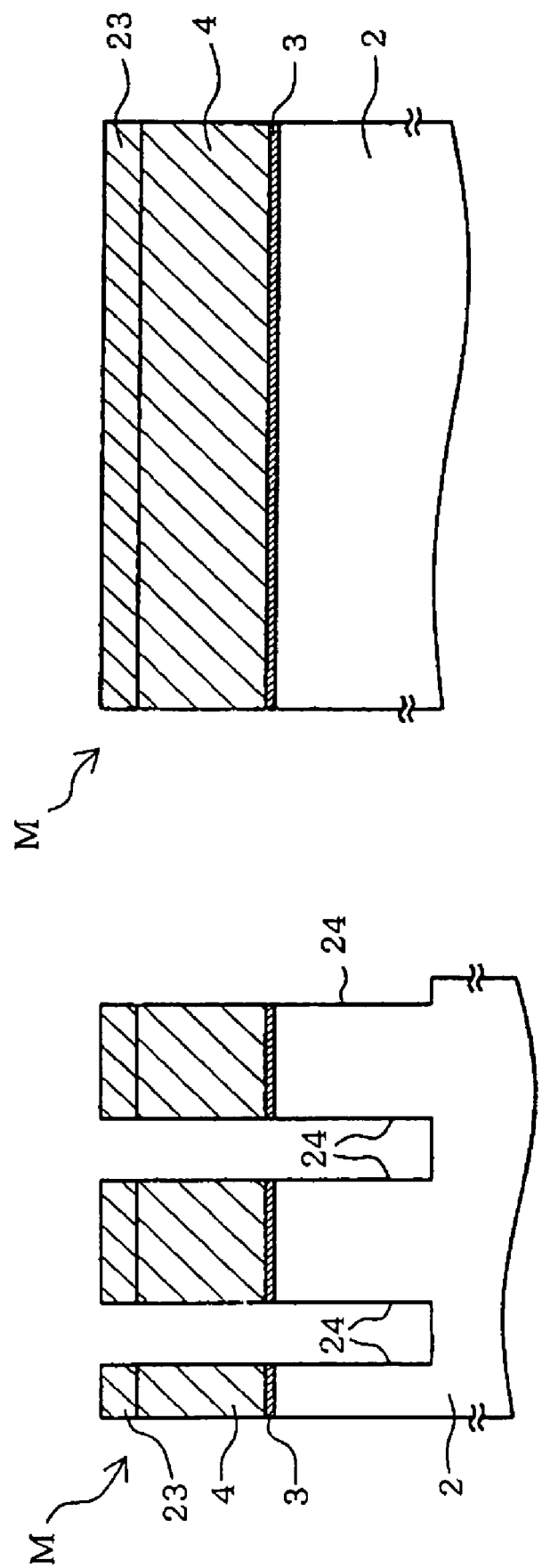

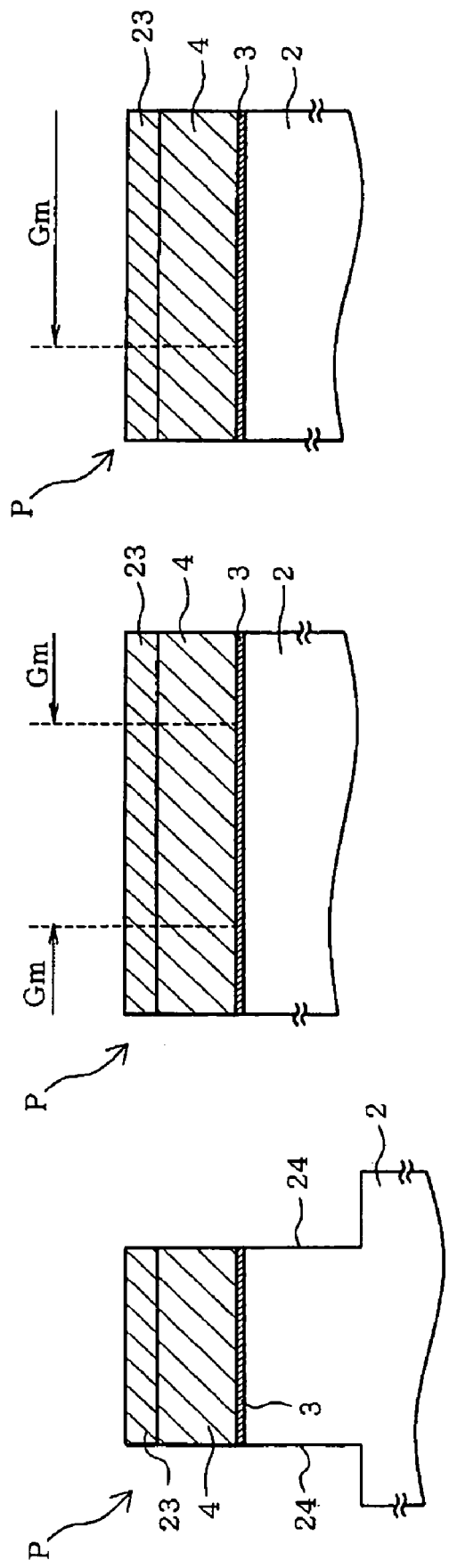

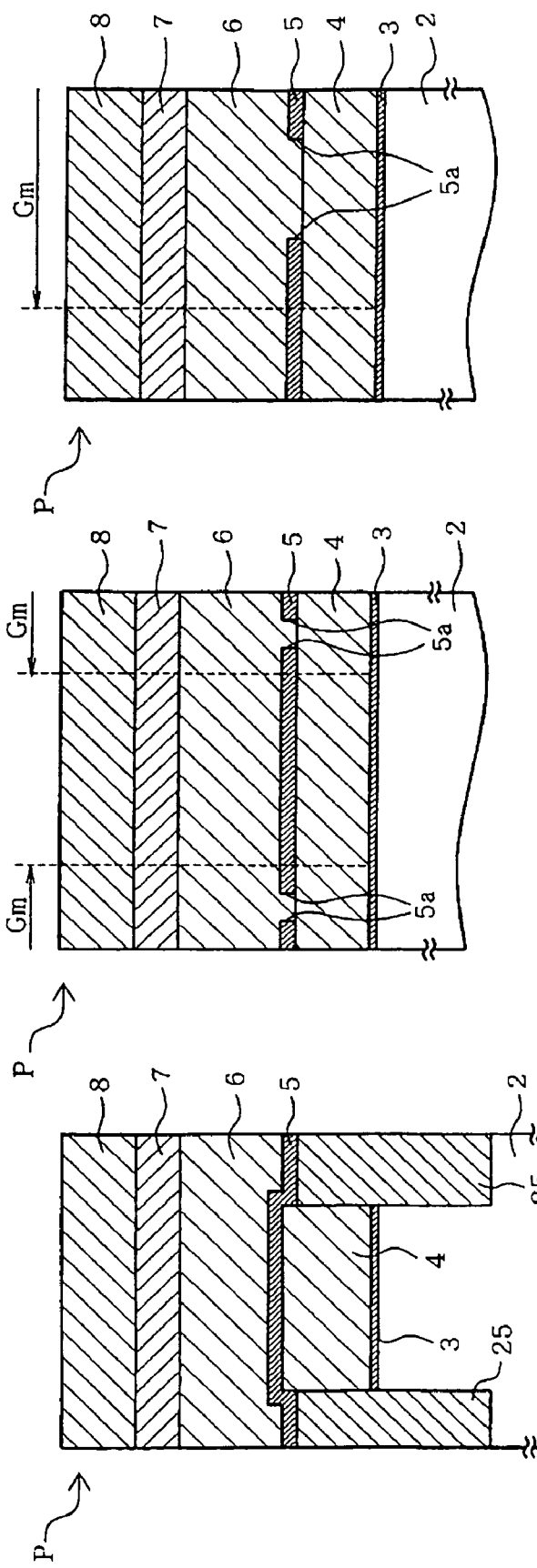

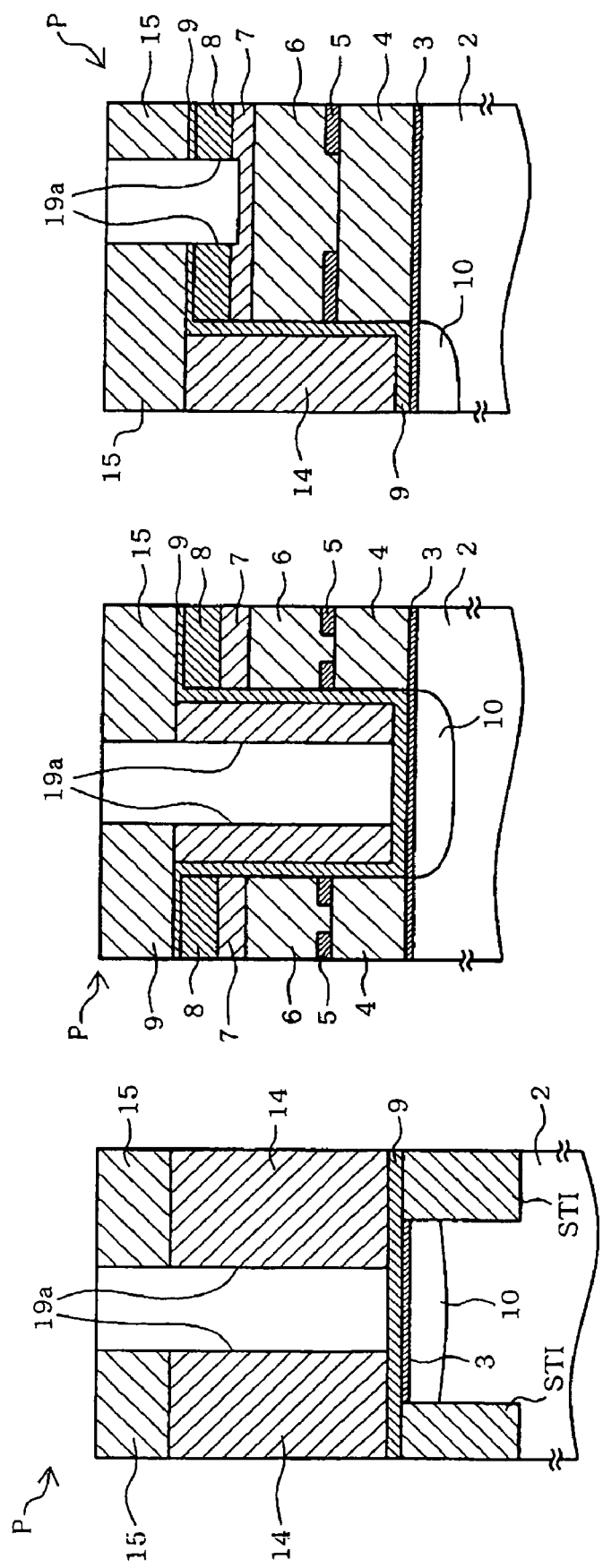

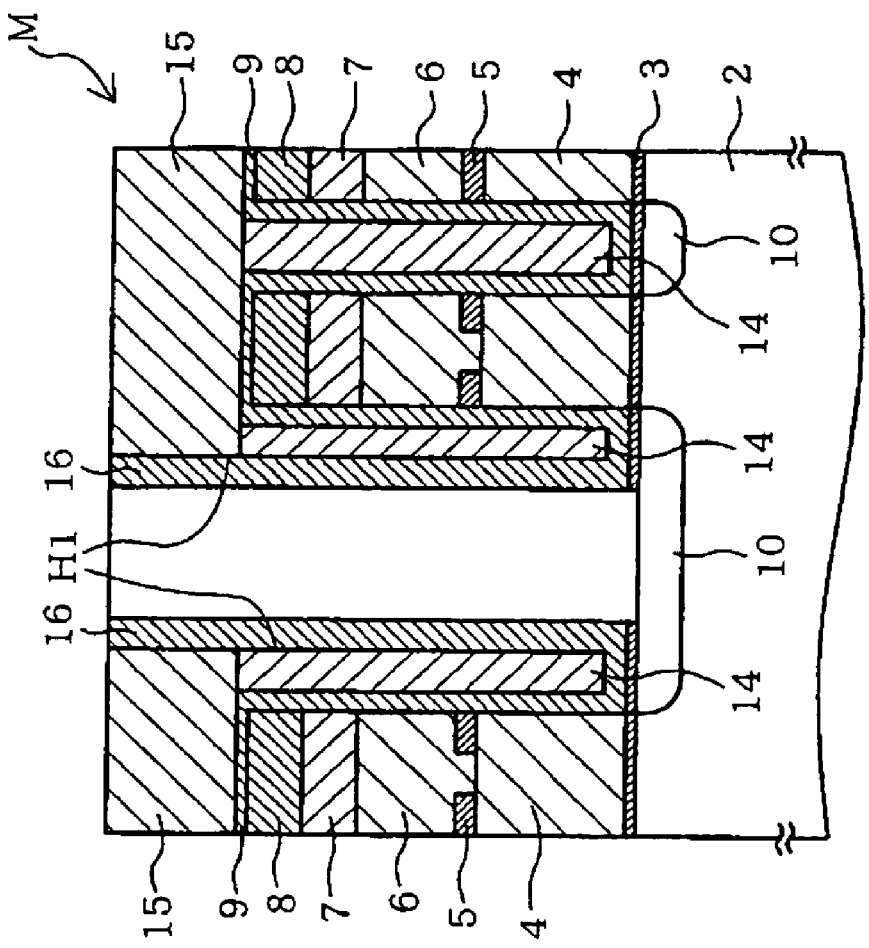
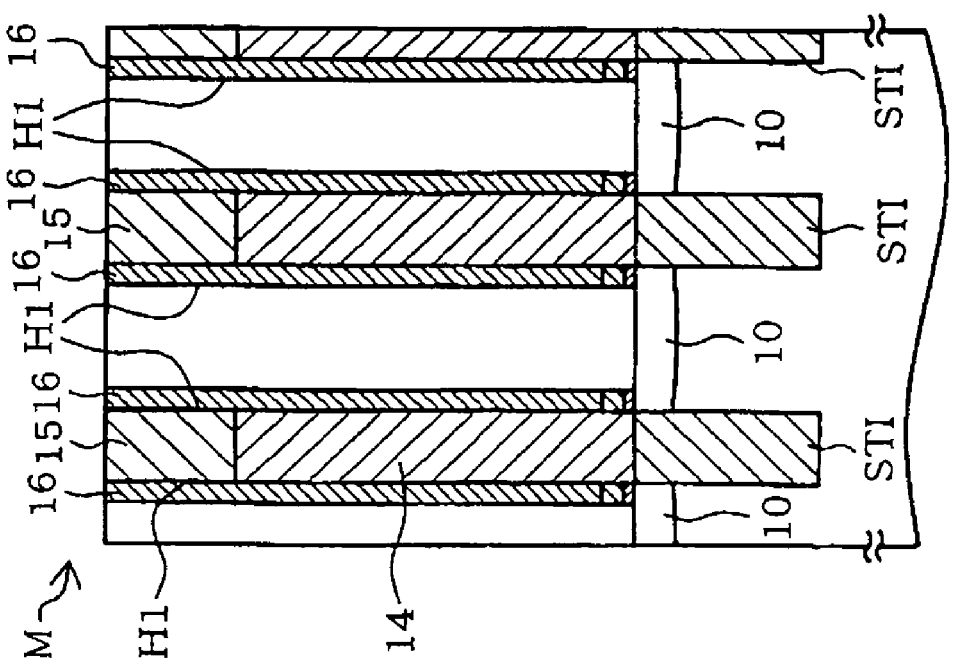
FIG. 8B
FIG. 8A

US 7,535,036 B2

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2005-99583, filed on Mar. 30, 2005, the entire contents of which are incorporated herein by reference.

BACKGROUND OF THE INVENTION

1. Field of the Invention

The present invention relates to a semiconductor device having a structure that an insulating film is formed as a spacer on an outer wall surface of a connection wiring layer and a method of manufacturing the same.

2. Description of the Related Art

A technique has been developed for forming a spacer insulating film on an outer wall surface of a connection wiring layer in order that a structural contact (short circuit) or electrical interaction may be prevented between connecting wiring layers adjacent to each other. For example, JP-A-6-310612 discloses a technique preventing contact between wiring layers or between the wiring layer and the substrate by an insulating film provided around the wiring layer and restraining a reduction in the reliability due to corrosion. Furthermore, the insulating film is formed by a chemical vapor deposition (CVD) process so that not only an upper surface of the wiring layer but also side faces and underside of the wiring layer are covered, whereby an effective insulating structure is provided.

On the other hand, a semiconductor device such as a nonvolatile memory device is divided into a memory cell region and a peripheral circuit region. Memory cell arrays are arranged in the memory cell region, whereas peripheral circuits for driving the memory cell arrays are formed in the peripheral circuit region.

A large number of electrical components (corresponding to a conductive layer) are arranged in the memory cell region. Accordingly, intervals between adjacent memory cells in the memory cell region are smaller as compared with those in the peripheral circuit region and the electrical components in the memory cell region has a higher degree of integration as compared with the peripheral circuit region. On the other hand, since electrical components are spaced farther away from each other in the peripheral circuit region, the electrical components in the peripheral circuit region has a lower degree of integration.

With reduction in design rules, a desired insulating performance needs to be maintained between the electrical components in the memory cell region having a higher integration degree, whereas a desired insulating performance also needs to be maintained between the electrical components in the peripheral circuit region having a lower integration degree.

SUMMARY OF THE INVENTION

Therefore, an object of the present invention is to provide a semiconductor device in which the insulating structure between the adjacent electrical components can be maintained when the electrical components of the memory cell and peripheral circuit regions are formed.

In one aspect, the present invention provides a semiconductor device comprising a semiconductor substrate divided into a memory cell region in which a memory cell is formed and a peripheral circuit region in which a peripheral circuit for driving the memory cell is formed, a plurality of conductive layers provided in each region so as to interpose an interlayer insulating film, a plurality of connection wiring layers formed in a plurality of holes which are formed in the interlayer insulating film so as to extend through the conductive layers of each region, the connection wiring layers electrically connecting the conductive layers, and a spacer insulating film functioning as a spacer which is formed on inner sidewall surfaces of the holes and outer sidewall surfaces of the connection wiring layers in each region.

In another aspect, the invention provides a method of manufacturing a semiconductor device, comprising forming a conductive layer in each of a memory cell region in which a memory cell is to be formed and a peripheral circuit region in which a peripheral circuit for driving the memory cell is to be formed, forming a first insulating film so that the conductive layer of each region is covered by the first insulating film, forming a plurality of holes in the first insulating film of each region by removing a plurality of predetermined regions of the first insulating film in each region, and forming second insulating films on inner sidewall surfaces of the holes in each region.

BRIEF DESCRIPTION OF THE DRAWINGS

Other objects, features and advantages of the present invention will become clear upon reviewing the following description of the embodiment with reference to the accompanying drawings, in which:

FIG. 1A is a sectional view of a bit line contact forming region in a memory cell region in a first embodiment of the present invention (No. 1);

FIG. 1B is also a sectional view of a bit line contact forming region in a memory cell region in a first embodiment of the present invention (No. 2);

FIGS. 4A, 5A, 6A, 7A and 8A are sectional views schematically showing a manufacturing step for the structure of FIG. 1A;

FIGS. 4B, 5B, 6B, 7B and 8B are sectional views schematically showing a manufacturing step for the structure of FIG. 1B;

FIGS. 4C, 5C, 6C, 7C and 8C are sectional views schematically showing a manufacturing step for the structure of FIG. 1C;

FIGS. 4D, 5D, 6D, 7D and 8D are sectional views schematically showing a manufacturing step for the structure of FIG. 1D; and FIGS. 4E, 5E, 6E, 7E and 8E are sectional views schematically showing a manufacturing step for the structure of FIG. 1E.

DETAILED DESCRIPTION OF THE INVENTION

One embodiment of the invention will be described with reference to FIGS. 1A to 8E. The semiconductor device of the invention is applied to a NAND flash memory.

Figures 1C, 1D, 1E:
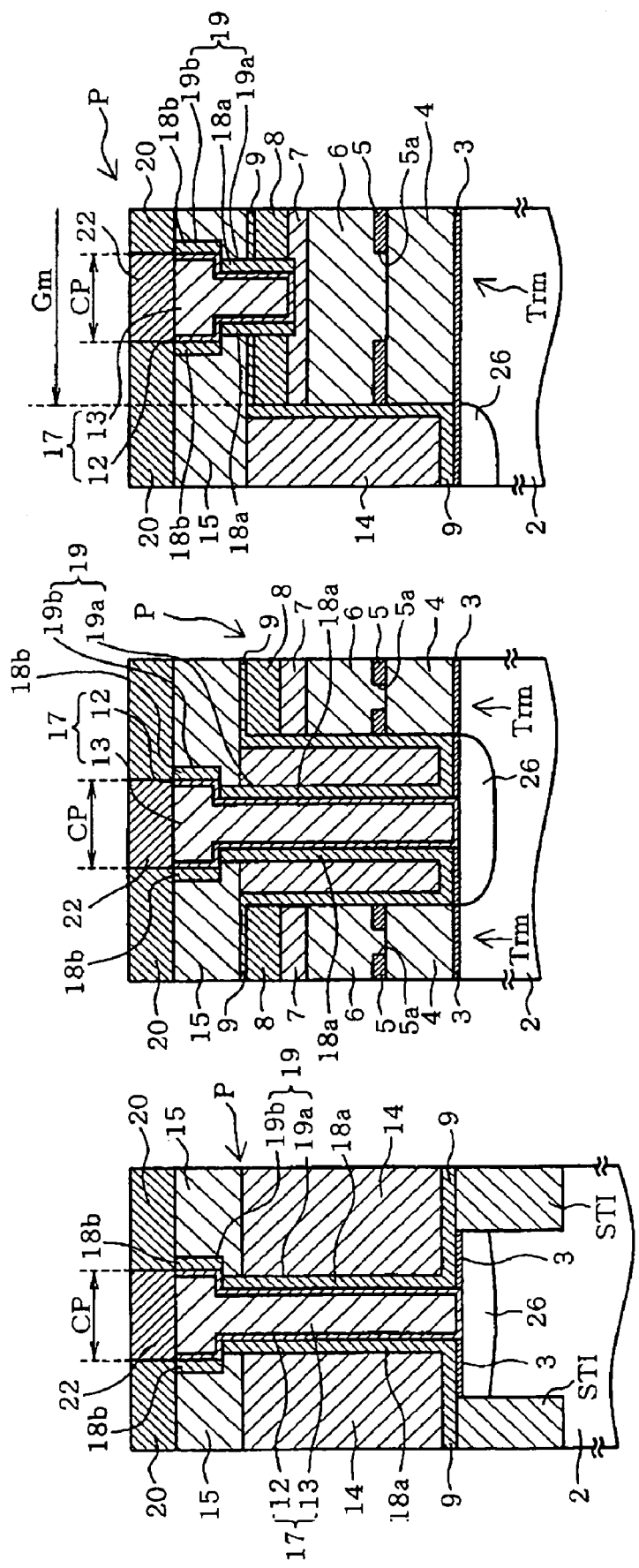
FIG. 1C is a sectional view of a contact region in a peripheral circuit region (No. 1)
FIG. 1D is also a sectional view of a contact region in a peripheral circuit region (No. 2)
FIG. 1E is also a sectional view of a contact region in a peripheral circuit region (No. 3)
Figure 3A:
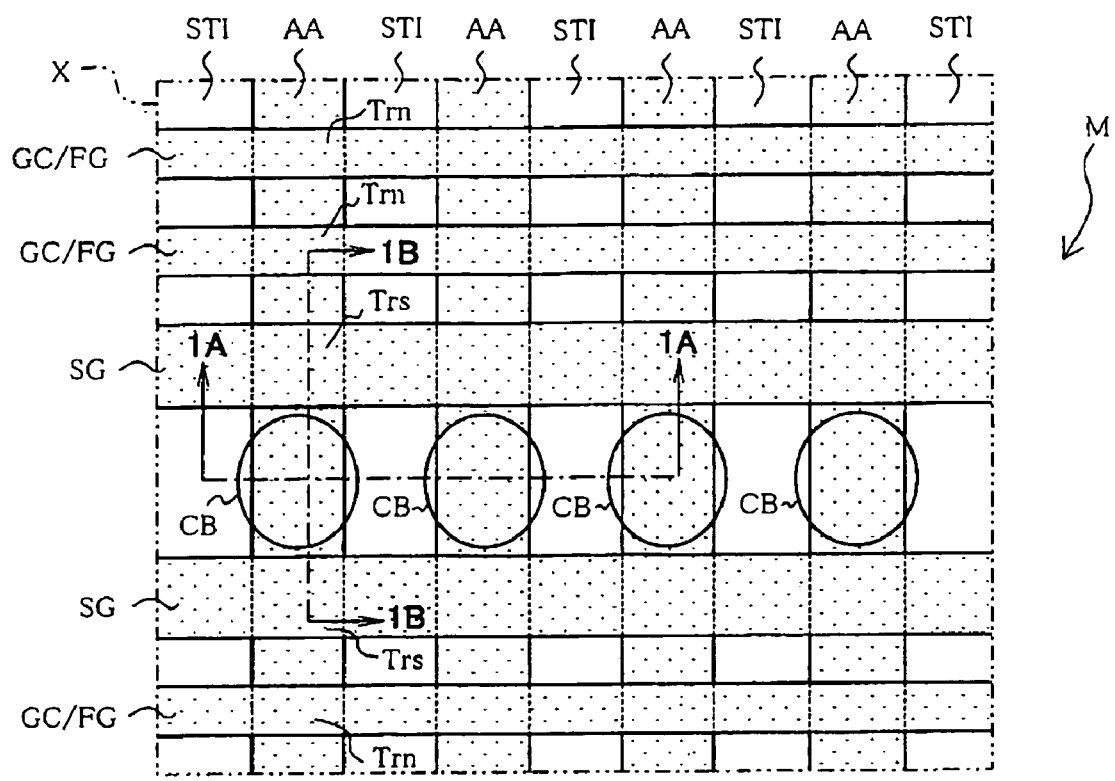
FIG. 3A is a plan view of a part of the memory cell region.
Figure 3B:
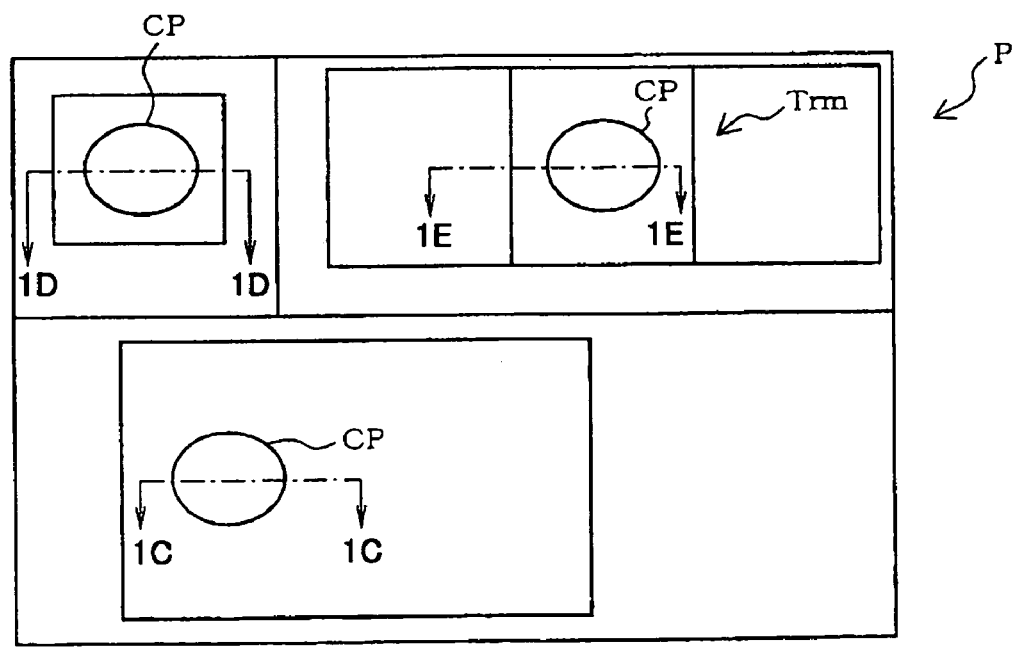
FIG. 3B is a plan view of a part of the memory cell region.
Figure 5B:
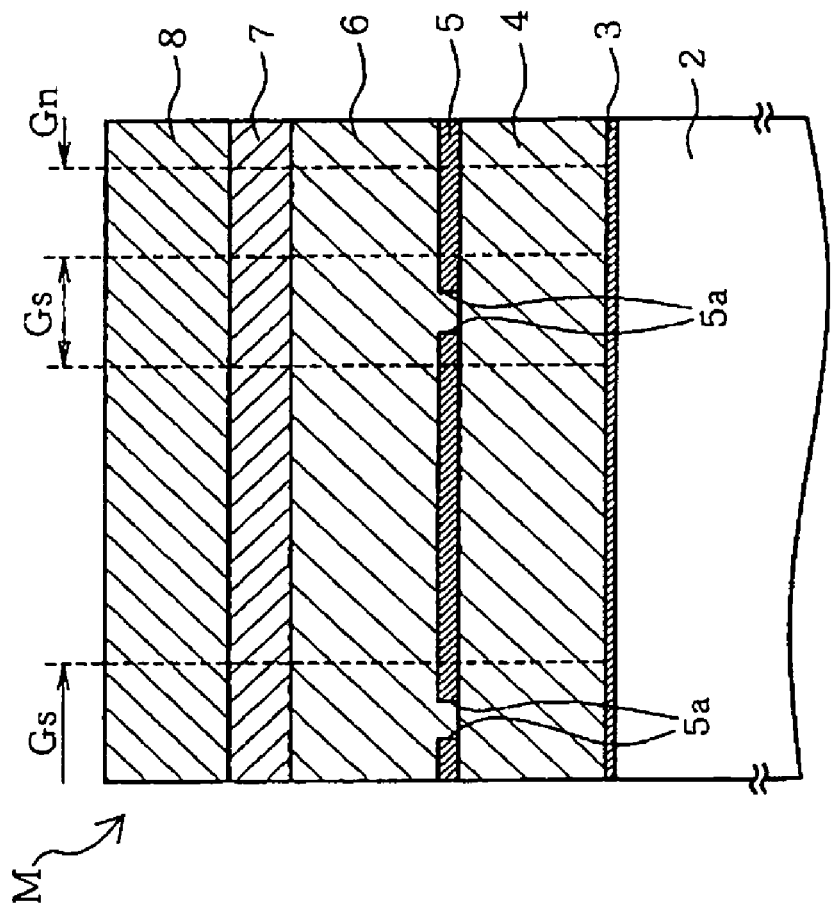
Figure 5A:
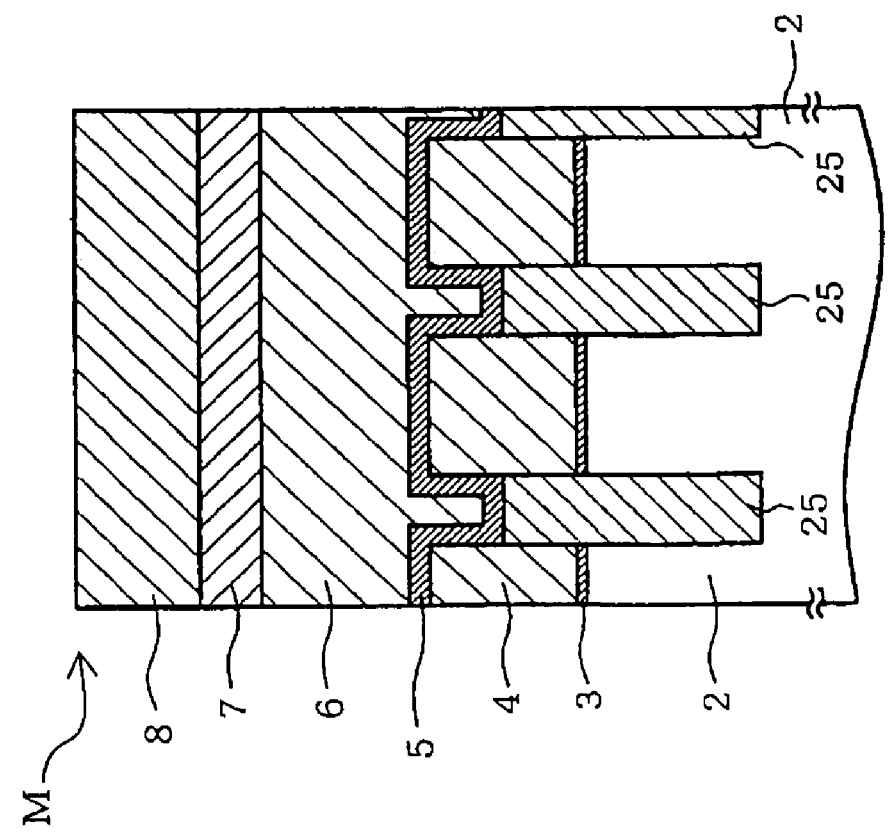

Referring to FIG. 3A, a memory cell region of the NAND flash memory is schematically shown partially. Furthermore, FIG. 3B schematically shows a part of a peripheral circuit region. FIG. 1A is a schematic sectional view taken along line 1A-1A in FIG. 3A. FIG. 1B is a schematic sectional view taken along line 1B-1B in FIG. 3A. FIG. 1C is a schematic sectional view taken along line 1C-1C in FIG. 3B. FIG. 1D is a schematic sectional view taken along line 1D-1D in FIG. 3B. FIG. 1E is a schematic sectional view taken along line 1E-1E in FIG. 3B.

Figure 2:
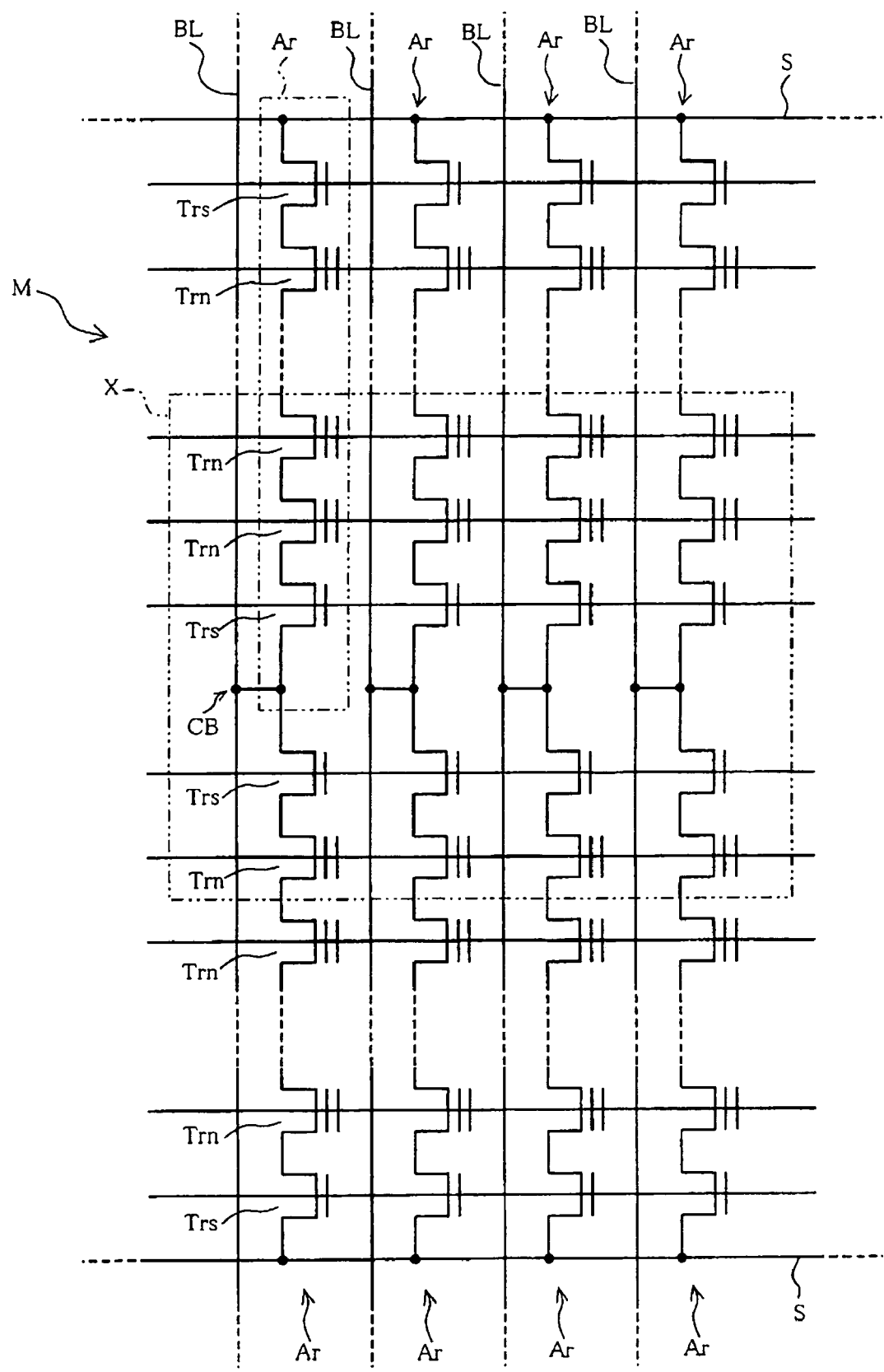
FIG. 2 illustrates an electrical arrangement in the memory cell region.

The NAND flash memory 1 includes p-type silicon substrate 2 serving as a semiconductor substrate as shown in FIGS. 3A and 3B. The silicon substrate 2 is divided into a memory cell region M and a peripheral circuit region P. FIG. 2 schematically shows an electric circuit configured in the memory cell region M. A large number of memory cell arrays Ar are formed in the memory cell region M. The memory cell arrays Ar are referred to as "NAND cell arrays." Each memory cell array Ar comprises a plurality of select gate transistors Trs formed at a bit line BL side and a source S side and a plurality (8 or 16: multiplication of 2 by its n-th square where n is a positive integer) of memory cell transistors Trn series connected between the select gate transistors Trs. The memory cell arrays Ar region ranged in a matrix.

A peripheral circuit for driving the memory cell arrays Ar in the memory cell region Ar is arranged in the peripheral circuit region P. FIG. 3B schematically shows part of the structure of the peripheral circuit region P. A peripheral transistor Trm is formed in the peripheral circuit region P. The transistors Trs, Trm and Trn are formed on the silicon substrate 2 in the embodiment. The embodiment is characterized by arrangements between an upper conductive layer 21 and a diffusion layer 10 in the memory cell region M and between an upper conductive layer 22 and a diffusion layer 26 in the peripheral circuit region P and a method of manufacturing the arrangements. Accordingly, these arrangements will be described in detail.

Structure

The following describes the structure of each of the transistors Trn and Trs in the memory cell region M and the structure of the peripheral transistor Trm in the peripheral circuit region P. Reference is made to FIGS. 1A to 3B.

In the NAND flash memory 1, as shown in FIG. 3A, the memory cell region M includes bit line contact forming regions CB aligned in a predetermined direction. Select gate electrodes SG extend in parallel to the bit line contact forming regions CB so as to be adjacent to the bit line contact forming regions CB.

Active regions AA (corresponding to an element forming region) are formed so as to be perpendicular to the bit line contact forming regions CB. Furthermore, a plurality of control gate electrodes GC extend in parallel to the bit line contact forming regions CB. Floating gate electrodes FG further extend in parallel to the bit line contact forming regions CB. Each floating gate electrode FG is formed in an region where the active regions AA and the control gate electrodes GC intersect.

Referring to FIGS. 1A and 3A, the element isolation region STI with the shallow trench isolation structure (STI) is formed between the active regions AA of two adjacent columns of memory cell arrays Ar in the silicon substrate 2. The element isolation region STI is arranged to maintain an insulating performance between the active regions AA of two adjacent columns of memory cell arrays Ar.

Referring to FIGS. 1B and 1C, the memory cell region M includes a gate electrode forming region Gn of the memory cell transistor Trn. In the gate electrode forming region Gn are deposited a first silicon oxide film 3 (corresponding to a first gate insulating film), a first polycrystalline silicon layer 4 doped with impurities, an ONO film 5 (corresponding to a second gate insulating film), a second polycrystalline silicon layer 4 doped with impurities, a tungsten silicide (WSi) layer 7 and a first silicon nitride film 8 on the silicon substrate 2 sequentially from the bottom.

Furthermore, the memory cell region M includes a gate electrode forming region Gs of the select gate transistor Trs. In the electrode forming region Gs are deposited a first silicon oxide film 3, the first polycrystalline silicon layer 4 doped with impurities, an ONO film 5, a second polycrystalline silicon layer 6 doped with impurities, a tungsten silicide layer 7, a first silicon nitride film 8 (a gate cap film) on the silicon substrate 2 sequentially from the bottom. Holes 5a vertically extending through the ONO film 5 are formed in the gate electrode forming region Gs of the select gate transistor Trs so that the first and second polycrystalline silicon layers 4 and 6 are structurally brought into contact with each other. Accordingly, the first and second polycrystalline silicon layers 4 and 6 and the tungsten silicide layer 7 are electrically conductively connected to one another.

Furthermore, the peripheral circuit region P includes a gate electrode forming region Gm of a peripheral transistor Trm. In the gate electrode forming region Gm are deposited a first silicon oxide film 3, the first polycrystalline silicon layer 4 doped with impurities, an ONO film 5 formed with a central through hole, the second polycrystalline silicon layer 6, the tungsten silicide layer 7 and the first silicon nitride film 8 sequentially from the bottom.

In the gate electrode forming region Gm of the peripheral transistor Trm, the holes 5a are formed so as to extend through the ONO film 5 so that the first and second polycrystalline silicon layers 4 and 6 are structurally brought into contact with each other. Accordingly, the first and second polycrystalline silicon layers 4 and 6 and the tungsten silicide layer 7 are electrically conductively connected to one another in the gate electrode forming region Gm of the peripheral circuit region P. The first and second polycrystalline silicon layers 4 and 6 and the tungsten silicide layer 7 serve as conductive layers.

In the memory cell region M, the first silicon oxide film 3 has a film thickness of 8 [nm] and serves as a tunnel insulating film for the transistors Trs and Trn. In the peripheral circuit region P, the first silicon oxide film 3 has a larger film thickness than the first silicon oxide film 3 in the memory cell region M, for example, a thickness of 40 [nm]. The first silicon oxide film 3 in the peripheral circuit region P serves as a tunnel insulating film for the peripheral transistor Trm.

In both memory cell and peripheral circuit regions M and P, the first polycrystalline silicon layer 4 is made of polycrystalline silicon doped with n-type impurities such as phosphor and having a film thickness of 100 [nm], for example. In the memory cell region M, the first polycrystalline silicon layer 4 in the gate electrode forming region Gn of the memory cell transistor Trn serves as the floating gate electrode FG (floating gate electrode: charge storage), as shown in FIG. 1B. Furthermore, the first polycrystalline silicon layer 4 serves a gate electrode of the select gate transistor Trs in the gate electrode forming region Gs.

In the memory cell region M, the second polycrystalline silicon layer 6 and tungsten silicide layer 7 serve as a control gate GC of the memory cell transistor Trn in the gate electrode forming region Gn of the memory cell transistor Trn, as shown in FIG. 1B. More specifically, the gate electrode of the memory cell transistor Trn is formed by depositing the floating gate electrode FG and the control gate electrode GC, that is, a stuck gate structure.

The first and second polycrystalline silicon layers 4 and 6 and the tungsten silicide layer 7 serve as a gate electrode in the gate electrode forming region Gm of the peripheral circuit region P, as shown in FIG. 1E. In the gate electrode forming region Gn of the memory cell transistor Trn, the ONO film 5 has a film thickness of 18 [nm] and comprises the silicon oxide film with a film thickness of 5 [nm], the silicon nitride film with a film thickness of 8 [nm] and the silicon oxide film with a film thickness of 5 [nm]. The ONO film 5 structurally separates each of the first and second polycrystalline silicon layers 4 and 6 from the other so that each of the first and second polycrystalline silicon layers 4 and 6 is maintained at high resistance. The ONO film 5 further maintains the floating gate electrode FG and control gate GC in an electrically high resistance. The second polycrystalline silicon layer 6 is made from polycrystalline silicon doped with n-type impurities such as phosphor (P) and has a film thickness of 80 [nm].

A silicon nitride film 9 serving as a gate barrier film is formed so as to cover the layers 4 to 8 in both memory cell and peripheral circuit regions M and P. The silicon nitride films 8 and 9 are formed so as to cover the gate electrodes SG, GC and FG in both memory cell and peripheral circuit regions M and P, thereby serving as a first insulating film. Although not shown, the silicon oxide film (not shown) is formed on sidewalls of the first polycrystalline silicon layer 4, ONO film 5 and second polycrystalline silicon layer 6 for security of reliability.

In the memory cell region M, a source/drain region 10 (source/drain diffusion layer corresponding to a conductive layer and referred to as "diffusion layer") is formed at the surface side of the silicon substrate 2 so as to be located between gate electrode forming regions Gs of the adjacent select gate transistors Trs, as shown in FIG. 1B. The diffusion layer 10 is formed with a contact layer (not shown) located at the surface side of the silicon substrate 2. In the memory cell region M, a connection wiring layer 11 of the bit line contact forming region DB is formed so as to be in contact with an upper surface of the contact layer of the diffusion layer 10. Although the connection wiring layer 11 is formed between the gate electrode forming regions Gs of the adjacent select gate transistors Trs, a self-alignment technique is not employed for the connection wiring layer 11.

In the memory cell region M, the connection wiring layer 11 comprises a barrier metal layer 12 and a metal layer 13 buried in the barrier metal layer 12. The barrier metal layer 12 is made from Ti or the like and functions to protect the metal layer 13. The metal layer 13 is made from tungsten or the like. In the memory cell region M, the connection wiring layer 11 is located between the gate forming regions Gs of the adjacent select gate transistors Trs. The connection wiring layer 11 electrically conductively connects an upper conductive layer 21 (corresponding to a conductive layer) serving as the bit line BL formed at the upper layer side and the diffusion layer 10 (corresponding to a conductive layer) formed at the surface side of the silicon substrate 2.

In the memory cell region M, the silicon oxide film 14 is formed between the connection wiring layer 11 and the second silicon nitride film 9 which is formed so as to covered by layers 4 to 8 of the gate electrode forming region Gs of the select gate transistor Trs. The silicon oxide film 14 serves as a first insulating film and an interlayer insulating film. Silicate glass such as BPSG may be used instead of the silicon oxide film 14. The silicon oxide film 14 is buried between the silicon nitride film 9 which is formed on the sides of the layers 4 to 8 so as to be covered by the layers 4 to 8 of the gate electrode forming region Gs of the select gate transistor Trs and the silicon nitride film 9 formed on the sides of the layers 4 to 8 so as to be covered by the layers 4 to 8 of the gate electrode forming region Gn of the memory cell transistor Trn.

In the memory cell region M, the silicon oxide film 14 is buried between the silicon nitride films 9 formed on the sidewalls of the layers 4 to 8 of the gate electrode regions Gn of the memory cell transistor Trn so as to be covered by the layers 4 to 8. The silicon nitride film 9 and the silicon oxide film 14 have respective upper surfaces which are formed so as to be co-planar. A silicon oxide film 15 is formed on the upper surfaces of the silicon nitride film 9 and the silicon oxide film 14. The silicon oxide film 15 functions both as a first insulating film and as an interlayer insulating film. More specifically, the silicon oxide films 14 and 15 and the silicon nitride films 8 and 9 function as the first insulating films. The first insulating films are formed so as to cover the select gate electrodes SG, control gate electrodes GC and floating gate electrodes FG all serving as gate electrodes.

In the memory cell region M, the silicon oxide films 14 and 15 have holes H1 respectively. The holes H1 are formed in the region including the bit line contact forming region CB to serve as contact holes. More specifically, the holes H1 extend through the silicon oxide films 14 and 15 in the memory cell region M from the upper conductive layer 21 side to the diffusion layer 10 at the surface side of the silicon substrate 2. Each hole H1 has an inner side wall formed with the silicon nitride film 16 (serving as the second insulating film). The connection wiring layer 11 is formed inside the silicon nitride film 16.

In the memory cell region M, the silicon nitride film 16 is formed between a side of the connection wiring layer 11 in the bit line contact forming region CB and sides of the silicon oxide films 14 and 15. The silicon nitride film 16 is formed on the inner side wall of each hole H1 and an outer wall of the connection wiring layer 11. The silicon nitride film 16 prevents structural contact between the connection wiring layers 11 formed in the adjacent bit line contact forming regions CB and maintains the electrically insulating performance between the adjacent connection wiring layers 11 together with the silicon oxide films 14 and 15.

The structure of the peripheral transistor Trm formed in the peripheral circuit region P will now be described with reference to FIG. 1D. In the peripheral circuit region P, a diffusion layer 26 (corresponding to a fourth conductive layer) is formed at the surface side of the silicon substrate 2 so as to be adjacent to the gate electrode forming region Gm of the peripheral transistor Trm. The diffusion layer 26 has a contact layer (not shown) formed at the surface side of the silicon substrate 2.

The connection wiring layer 17 is formed so as to be in contact with an upper surface of the contact layer of the diffusion layer 26 in a region CP of the peripheral circuit region P. The connection wiring layer 17 is formed inside each hole 19. An upper conductive layer 22 is formed on the top of the connection wiring layer 17. The interlayer insulating film 20 is formed around the upper conductive layer 22. The interlayer insulating film 20 is made of a silicon oxide film, silicate glass or the like. The upper conductive layer 22 is made from tungsten, for example.

The hole 19 leading to the upper surface of the diffusion layer 26 is formed in the peripheral circuit region P, as shown in FIG. 1D. The hole 19 is provided in order that each connection wiring layer 17 may be buried in the region CP. The hole 19 extends from the upper conductive layer 22 (corresponding to a third conductive layer) formed at the upper layer side through the silicon oxide films 14 and 15 to the upper surface of the diffusion layer 26 formed at the surface side of the silicon substrate 2. The hole 19 includes a lower hole 19a serving as a first contact hole and an upper hole 19b formed as a second contact hole above the lower hole 19a and having a larger diameter than the lower hole 19a.

The upper hole 19b is formed substantially into a circular or elliptic shape as viewed at the top of the silicon oxide film 15. The lower hole 19a is formed substantially into a circular or elliptic shape as viewed at the bottom side or the silicon oxide film 14. Inside the hole 19 are formed the connection wiring layer 17 and silicon nitride films 18a and 18b serving as spacer insulating films functioning as spacers on the outer wall of the connection wiring layer 17. More specifically, the silicon nitride film 18b is formed on the inner wall surface of the upper hole 19b, whereas the silicon nitride film 18a is formed on the inner wall surface of the lower hole 19a. The connection wiring layer 17 is formed inside the silicon nitride films 18a and 18b.

Furthermore, another peripheral transistor Trm will be described with reference to FIG. 1E. The hole 19 is formed in the forming region (region CP) for the connection wiring layer 17 electrically connecting the gate electrode of the peripheral transistor Trm to the upper conductive layer 22. The hole 19 extends from the upper conductive layer 22 side to the upper surface of the tungsten silicide layer 7. In the hole 19 are formed the connection wiring layer 17 and the silicon nitride films 18a and 18b both serving as spacers formed on the outer wall of the connection wiring layer 17. The silicon nitride film 18a is formed on the inner wall surface of the lower hole 19a, whereas the silicon nitride film 18b is formed on the inner wall surface of the upper hole 19b.

In the peripheral circuit region P, the through hole 19 extends from the lower part of the upper conductive layer 22 through the silicon oxide film 15, silicon nitride films 8 and 9 to the tungsten silicide layer 7. The hole 19 includes the upper hole 19b and the lower hole 19a located lower than the upper hole 19b and having a smaller diameter than the upper hole 19b. The upper hole 19b is formed substantially into an elliptic or circular shape as viewed at the top of the silicon oxide film 15. The lower hole 19a is located substantially centrally with respect to the silicon nitride films 8 and 9 and is formed substantially into an elliptic or circular shape.

In the peripheral circuit region P, the connection wiring layer 17 comprises a barrier metal layer 12 and a metal layer 13 buried in the barrier metal layer 12. The barrier metal layer 12 is made from Ti, TiN or the like and serves to protect the metal layer 13 from other films. The metal layer 13 is made from tungsten, for example. Further in the peripheral circuit region P, the connection wiring layer 17 is formed inside the holes 19a and 19b. The diffusion layer 10 is formed at the surface side of the silicon substrate 2 around the gate electrode forming region Gm of the peripheral transistor Trm. A contact layer (not shown) is formed at the surface side of the diffusion layer 10, so that the connection wiring layer 17 is formed so as to come into contact with the contact layer.

The connection wiring layer 17 electrically conductively connects the upper conductive layer 22 (corresponding to a third conductive layer) formed at the upper layer side and the diffusion layer 10 formed at the surface side of the silicon substrate 2. In the peripheral circuit region P, the silicon nitride film 9 is formed so as to cover the layers 4 to 8 of the gate electrode forming region Gm of the peripheral transistor Trm. The silicon oxide film 14 is formed between the silicon nitride film 9 and the connection wiring layer 17. In the peripheral circuit region P, the silicon oxide film 14 maintains the electrical components of the peripheral circuit region P in an electrically high resistance. In the peripheral circuit region P, the silicon nitride film 9 and the silicon oxide film 14 have respective upper surfaces which are formed so as to be co-planar. The silicon oxide film 15 is formed on the silicon nitride film 9 and the silicon oxide film 14. The silicon oxide film 15 functions both as the first insulating film and as the interlayer insulating film.

In the peripheral circuit region P, the connection wiring layer 17 and the silicon nitride films 18a and 18b (corresponding to the second insulating film) are formed in the lower and upper holes 19a and 19b of the hole 19 formed in the region CP. The silicon nitride films 18a and 18b are between the connection wiring layer 17 and the silicon oxide film 14. The silicon nitride films 18a and 18b serve as spacers but are each separated into two parts. For the sake of description, the film formed in the lower hole 19a is referred to as "silicon nitride film 18a" and the film formed in the upper hole 19b is referred to as "silicon nitride film 18b." The silicon nitride film 18b is formed both on the inner wall surface of the upper hole 19b and on the outer wall surface of the connection wiring layer 17. Furthermore, the silicon nitride film 18a is formed both on the inner wall surface of the lower hole 19a and on the outer wall surface of the connection wiring layer 17.

In the peripheral circuit region P, the silicon nitride films 18a and 18b prevent contact between the connection wiring layers 17 formed in the adjacent regions CP and maintain an electrically high resistance between the connection wiring layers 17 together with the silicon oxide films 14 and 15, thereby functioning as spacer insulating films.

In the peripheral circuit region P, a shortest distance between the regions CP is set at a value about several times larger than a shortest distance between the adjacent bit line contact forming regions CB in the memory cell region M (larger than 1). However, with reduction in the design rules, a desired insulating performance cannot be achieved between the adjacent connection wiring layers 17 in the peripheral circuit region P. The reason for this is that it is more difficult to ensure a designed margin as a distance between the regions CP become short.

In the arrangement of the embodiment, the silicon nitride films 18a are formed inside the lower hole 19a (on the inner wall surface) and on the outer wall surface of the connection wiring layer 17 in the peripheral circuit region P. Furthermore, the silicon nitride films 18b are formed on the inner wall surface of the upper hole 19b and on the outer wall surface of the connection wiring layer 17. Consequently, even when the shortest distance between the adjacent regions CP becomes shorter than in the conventional arrangement, a reduction in the designed margin in the peripheral circuit region P can be restrained.

Manufacturing Method

The manufacturing method of the embodiment will be described with reference to FIGS. 4A to 8E. FIGS. 4A, 5A, 6A, 7A and 8A are sectional views taken along line 1A-1A in FIG. 3A. FIGS. 4B, 5B, 6B, 7B and 8B are sectional views taken along line 1B-1B in FIG. 3A. FIGS. 4C, 5C, 6C, 7C and 8C are sectional views taken along line 1C-1C in FIG. 3B. FIGS. 4D, 5D, 6D, 7D and 8D are sectional views taken along line 1D-1D in FIG. 3B. FIGS. 4E, 5E, 6E, 7E and 8E are sectional views taken along line 1E-1E in FIG. 3B. On condition that the manufacturing method in accordance with the invention can be realized, one or more of the steps which will be described later may be eliminated and/or one or more ordinary steps may be added.

(1) Forming Process of the Structure as Shown in FIGS. 4A-4E:

The p-type silicon substrate 2 (silicon semiconductor substrate) in the memory cell region M is heat-treated in an atmosphere of steam at 750° C. so that the first silicon oxide film 3 serving as the first gate insulating film (gate oxide film) is formed so as to have a film thickness of 10 [nm]. Furthermore, the first silicon oxide film 3 is formed so as to have a film thickness of 40 [nm] in the gate electrode forming region Gm of a high breakdown voltage peripheral transistor Trm in the peripheral circuit region P.

Subsequently, in the memory cell and peripheral circuit regions M and P, the first polycrystalline silicon layer 4 doped with n-type impurities such as phosphor is formed by the LPCVD process so as to have a film thickness of 140 [nm]. The first silicon nitride film 23 is formed on the first polycrystalline silicon layer 4 so as to have a film thickness of 70 [nm]. Resist is applied to the first silicon nitride film 23 to be formed into a pattern. The first silicon nitride film 23 is processed by the RIE process with the patterned resist serving as a mask. In this case, the region to be eliminated by the processing of the first silicon nitride film 23 is a region in which an element isolation region STI is to be formed. Next, the first polycrystalline silicon layer 4, the first silicon oxide film 3 and the silicon substrate 2 are processed with the first silicon nitride film 23 serving as a mask, so that a trench 24 is formed in an upper part of the silicon substrate 2.

(2) Forming Process of the Structure as Shown in FIGS. 5A-5E:

Subsequently, the second silicon oxide film 25 is deposited by a film thickness of, for example, 750 [nm] by the HDP-CVD process. As a result, the second silicon oxide film 25 is formed in the trench 24. Next, an upper part of the second silicon oxide film 25 is flattened with the first silicon nitride film 23 serving as a stopper by the CMP process until an upper surface of the first silicon nitride film 23 is reached. The flattened upper part of the second silicon oxide film 25 is then heat-treated in an atmosphere of nitrogen at 850° C. Furthermore, the second silicon oxide film 25 is etched back by the RIE process upward from the upper surface of the silicon substrate 2 until a predetermined level is reached, so that the second silicon oxide film 25 is adjusted to a predetermined level. Subsequently, the first silicon nitride film 23 is removed by phosphating at 150° C.

Subsequently, the ONO film 5 (three-layer film of silicon oxide film with a film thickness of 5 nm, silicon nitride film with a film thickness of 8 nm and silicon oxide film with a film thickness of 5 nm) is formed by the LPCVD process. The holes 5a are formed in the ONO film 5 in the central gate electrode forming regions Gs and Gm. The second polycrystalline silicon layer 6 doped with n-type impurities such as phosphor is formed on the ONO film 5 and the first polycrystalline silicon layer 4 so as to have a film thickness of 120 [nm]. The tungsten silicide layer 7 is formed on the second polycrystalline silicon layer 6 so as to have a film thickness of 120 [nm]. The second silicon nitride film 8 serving as a gate cap film is formed on the tungsten silicide layer 7 so as to have a film thickness of 220 [nm].

Figure 6B:
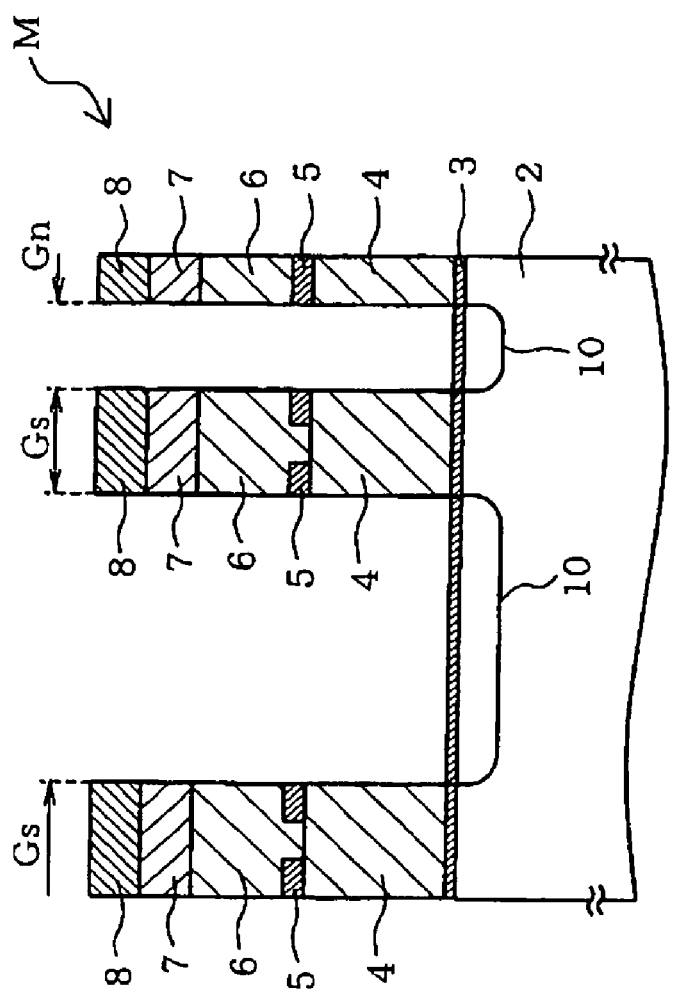
Figure 6A:
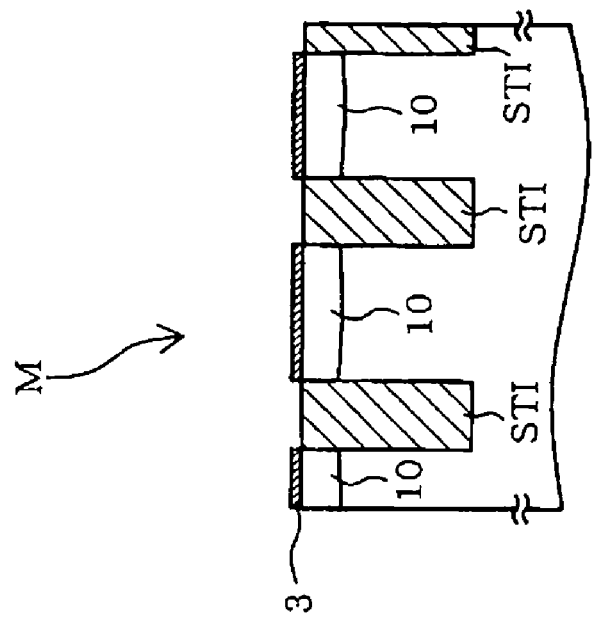
Figure 6E:
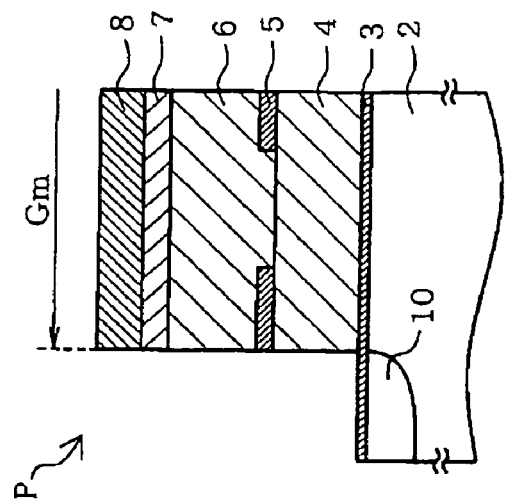
Figure 6D:
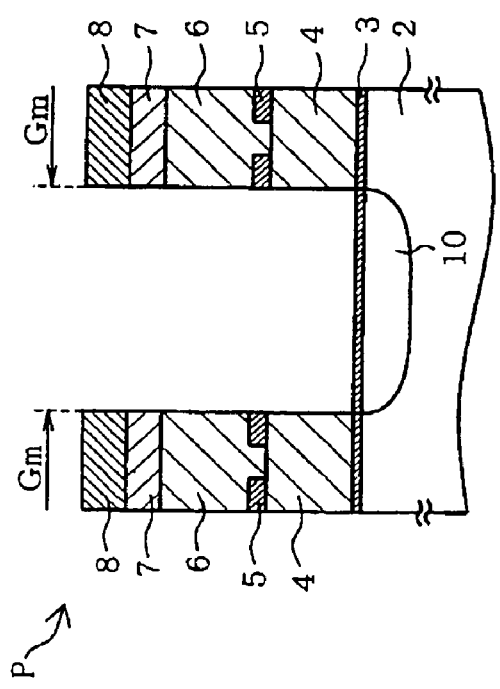
Figure 6C:
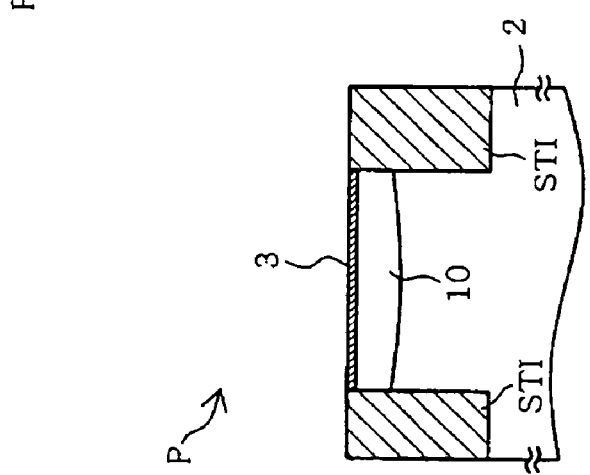
Figure 7B:
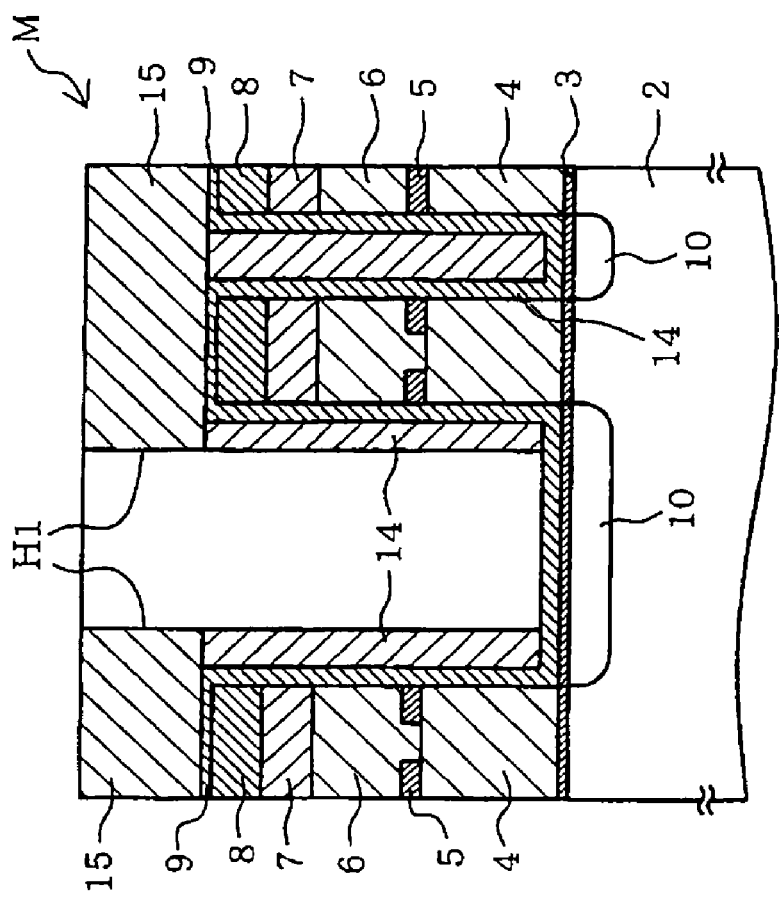
Figure 7A:
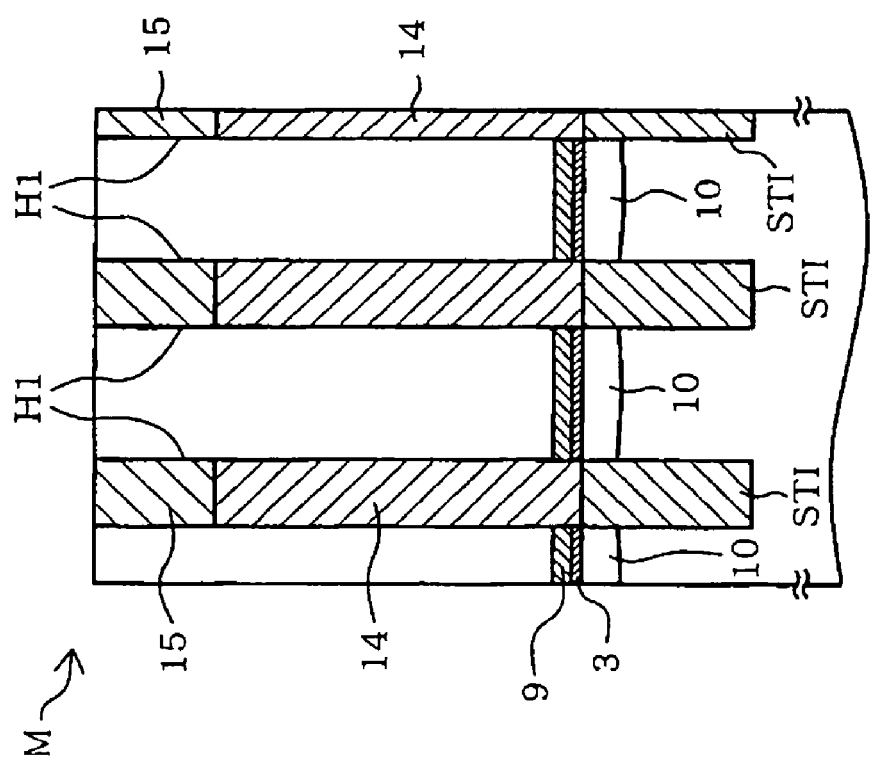

(3) Forming Process of the Structure as Shown in FIGS. 6A-6E:

The forming process of the structure as shown in FIGS. 6A to 6E is simultaneously carried out in the memory cell region M and the peripheral circuit region P. Resist (not shown) is applied to the second silicon nitride film 8 after having been formed. Subsequently, the resist is patterned by the photolithography technique. The second silicon nitride film 8 is etched with the resist pattern serving as a mask by the RIE process. In this case, the second silicon nitride film 8 is etched regarding the region except for the gate electrode forming regions Gs, Gn and Gm as shown in FIG. 6B. The resist pattern is then removed. Subsequently, the layers 4 to 8 are etched with the second silicon nitride film 8 serving as a mask. The processing is carried out in order that the layers 4 to 8 of the gate electrode forming regions Gs, Gn and Gm may be separated, as shown in FIG. 6B.

Consequently, a separated structure of the floating gate electrode FG and control gate electrode GC can be configured, and a plurality of gate electrodes (floating gate electrodes FG and control gate electrodes GC) can be aligned. Subsequently, ion is implanted to the regions in the upper part of the silicon substrate 2 except for the gate electrode forming regions Gs, Gn and Gm, so that the diffusion layer 10 of the memory cell region M and the diffusion layer 26 of the peripheral circuit region P are formed.

(4) Forming Process of the Structure as Shown in FIGS. 7A-7E:

The forming process of the structure as shown in FIGS. 7A to 7E is simultaneously carried out in the memory cell region M and the peripheral circuit region P. A third silicon nitride film 9 serving as a gate barrier film is isotropically formed so as to cover the separated layers 3 to 8. Subsequently, the third silicon oxide film 14 is deposited on the third silicon nitride film 9. Next, the third silicon oxide film 14 is flattened to the upper surface of the third silicon nitride film 9.

Subsequently, the fourth silicon oxide film 15 is deposited, and resist (not shown) is applied to the film 15. The resist is patterned by the photolithography technique. An etching process is carried out with the patterned resist serving as a mask so that the silicon oxide films 14 and 15 are simultaneously removed from the bit line contact forming region CB of the memory cell region M and the region CP of the peripheral circuit region PC. In this process, the silicon oxide film is removed by an etching condition with higher selectivity for the silicon nitride film. As a result, the holes H1 can be formed in the regions including the bit line contact forming region CB in the memory cell region M and simultaneously, the lower holes 9a can be formed in a part of the region PC in the peripheral circuit region P. Subsequently, the resist is removed by the O$_2$-plasma process.

Figures 8C, 8D, 8E:
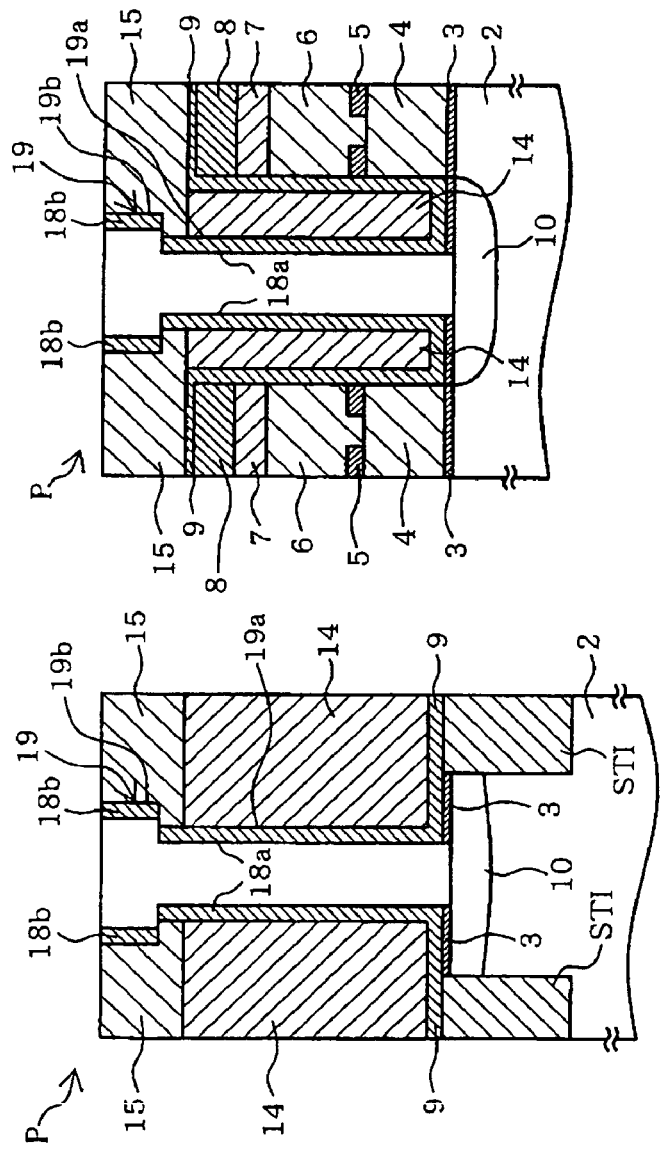

(5) Forming Process of the Structure as Shown in FIGS. 8A-8E:

After the structure as shown in FIGS. 7A-7E has been formed, resist (not shown) is applied and patterned, and then, an etching process is carried out. As shown in FIGS. 8C to 8E, the silicon oxide film 15 is etched in the region CP of the peripheral circuit region P by the RIE process thereby to be removed, and the upper hole 19b is formed so as to have a larger diameter than the lower hole 19a and be located upper than the lower hole 19a.

Subsequently, a wet etching process is carried out so that a spontaneous oxide film and reaction product produced during the etching can be removed. Before the wet etching process, the silicon nitride films 16 and 18 are isotropically formed and etched by the RIE process so that the silicon nitride film 16 is formed as a spacer on the inner wall surface of the hole H1 in the memory cell region M as shown in FIGS. 8A and 8B and simultaneously, the silicon nitride film 18 is formed as a spacer on the inner wall surface of the hole 19 (upper and lower holes 19b and 19a) in the peripheral circuit region P as shown in FIGS. 8C to 8E.

Subsequently, as shown in FIGS. 1A to 1E, the barrier metal layer 12 and the metal layer 13 are formed inside the silicon nitride films 16, 18*a* and 18*b*. The barrier metal layer 12 and metal layer 13 are removed so that the upper surface of the silicon oxide film 15 is reached. Subsequently, the interlayer insulating film 20 is formed. The interlayer insulating film 20 is removed in the bit line contact forming region CB and the region CP. The upper conductive layers 21 and 22 serving as conductive layers are buried in the removed region. Thus, the NAND flash memory as shown in FIGS. 1A to 1E is manufactured.

As described above, when the spontaneous oxide film and reaction product produced during the etching are removed after formation of the holes H1, 19*a* and 19*b*, the wet etching can produce a large effect. Even if the silicon nitride films 16 and 18 should not be provided as the spacers on the inner wall surfaces of the holes H1 and 19, the central portions of holes H1 and 19 would be swollen as the result of execution of the wet etching such that the holes would be overhung. Thereafter, even when barrier metal layer 12 and metal layer 13 are buried in the holes H1 and 19, void occurs near the central interior of each hole.

In view of the problem, it is desirable that the silicon nitride films 16 and 18 should be provided as the spacers on the inner wall surfaces of the holes H1, 19*a* and 19*b* before the spontaneous oxide films and reaction product are processed by wet etching. Consequently, the diameters of the holes H1 and 19 are prevented from being increased. In this case, although the reaction product can be removed by the dry etching, the wet etching can achieve a larger effect. Accordingly, the occurrence of void can be prevented inside the holes H1 and 19 and the connection wiring layers 11 and 17 can be buried in the holes H1 and 19.

Since a large number of elements constituting the memory cell (memory cell transistor Trn, for example) in the memory cell region M, the space between the adjacent memory cells is narrower than the space between the elements in the peripheral circuit region and accordingly, a degree of density of elements (degree of integration) is higher. On the other hand, the space between the adjacent elements (a peripheral transistor, for example) in the peripheral circuit region P memory cells is wider than the space between the elements in the memory cell region and accordingly, a degree of density of elements (degree of integration) is lower. Accordingly, design values of pattern widths of layers composing the memory cell transistor Trn tends to be smaller than the peripheral circuit region P in the memory cell region M. The processing needs to be determined in view of various margins in constituting a semiconductor element. However, since the pattern width tends to be narrowed in the memory cell region M with reduction in the design rules, an absolute amount of margin required in the forming of the memory cell transistor Trn of the memory cell region M becomes smaller than an absolute amount of margin in the forming of a semiconductor element (a peripheral transistor Trm) in the peripheral circuit region P.

Accordingly, when processing is carried out to form the holes H1 and lower holes 19*a* simultaneously in the memory cell region M and the peripheral circuit region P, processing conditions (exposure condition, for example) are set while a priority is given to margins in the memory cell region M. As a result, design margins in the peripheral circuit region P becomes smaller than the case where the peripheral circuit region P is singly processed.

As described above, when processing is carried out in the same step to form the holes H1 and lower holes 19*a* simultaneously in the memory cell region M and the peripheral circuit region P, resist (not shown) is applied to forming regions of the holes H1 and lower holes 19*a* and exposed to light. In this case, since the focus margin in the memory cell region M is smaller than the focus margin in the peripheral circuit region P, it is desirable to set conditions so that priority is given to positioning the hole H1 in the memory cell region M at an optimum position and obtaining a diameter approximate to an optimum one and to expose the resist pattern to light. In this case, the peripheral circuit region P is not set for an optimum exposure condition, whereupon focus margin is reduced. As a result, the position and diameter of the lower hole 18*a* in the peripheral circuit region P are shifted from desired set values (rendered larger, for example).

In the manufacturing method of the embodiment, however, the silicon nitride films 16 and 18 are simultaneously formed in the memory cell region M and the peripheral circuit region P. In this case, when the silicon nitride film 18 is formed on the inner wall surface of the hole 19 so as to have substantially the same film thickness as the silicon nitride film 16, particularly the diameter of the lower hole 19*a* is rendered smaller. Accordingly, even when the position and diameter of the lower hole 18*a* in the peripheral circuit region P are shifted from desired set values in the step of forming the lower hole 18*a*, the silicon nitride films 16 and 18 are formed on the inner wall surfaces of the holes H1 and 19. Consequently, an adverse effect on the adjacent semiconductor elements (components, for example, peripheral transistor Trm) can be restrained.

Accordingly, even when the third and fourth silicon oxide films 14 and 15 are simultaneously etched in the memory cell and peripheral circuit regions M and P on the condition having higher selectivity to the silicon nitride film, the design can be adjusted to shifted dimensions since the silicon nitride films 16 and 18 are thereafter formed. As described above, the wet etching is carried out when the reaction product in the etching is removed. However, the wet etching need not be refrained form execution.

According to the manufacturing method of the embodiment, the third silicon oxide film 14 is buried simultaneously in the memory cell region M and the peripheral circuit region P, and the fourth silicon oxide film is buried simultaneously in the memory cell region M and the peripheral circuit region P. The holes H1 and 19*a* are simultaneously formed and thereafter, the silicon nitride films 16, 18*a* and 19*a* are simultaneously formed isotropically in the holes H1 and 19. The silicon nitride films 16, 18*a* and 18*b* formed on the silicon substrate 2 are etched by the RIE process thereby to be removed simultaneously. As a result, the silicon nitride films 16, 18*a* and 18*b* remains on the inner wall surfaces of the holes H1 and 19, and the silicon oxide film 3 is removed so that the upper surface of the silicon substrate 2 is exposed. The barrier metal layer 12 and the metal layer 13 are formed on the exposed upper surface of the silicon substrate 2.

In this case, the barrier metal layer 12 and the metal layer 13 can be formed inside the silicon nitride films 16 and 18 remaining on the inner wall surfaces of the holes H1 and 19. In other words, since the silicon nitride films 16 and 18 are formed on the inner wall surfaces of the holes H1 and 19 and the outer wall surfaces of the connection wiring layers 11 and 17, the design can be adjusted to the shifted dimensions, whereby particularly the position and diameter of the lower hole 19*a* formed in the peripheral circuit region P can be optimized.

The invention should not be limited to the foregoing embodiment. The embodiment may be modified or expanded as follows. Although the invention is applied to the p-type silicon substrate 2 as the semiconductor substrate in the foregoing embodiment, the invention may be applied to another semiconductor substrate, instead.

Although the silicon nitride films 16 and 18 are formed into the spacer insulating films in the foregoing embodiment, a silicon oxide film (tetraethyle orthosilicate (TEOS), for example) or the like may be used, instead.

The holes H1 and 19 are formed in the bit line contact forming region CB and the region CP in the memory cell region M and the peripheral circuit region P in the foregoing embodiment. However, the holes may be formed in a contact plug forming region electrically connecting a contact region between the diffusion layers 10 and 26 formed at the surface side of the silicon substrate 2 and a conductive layer (not shown) formed above the contact region in the memory cell region M and the peripheral circuit region P and/or a plug forming region electrically connecting between multilayer wiring structures in the memory cell region M and the peripheral circuit region P, or the like.

Although the holes H1 and 19 are simultaneously formed in the memory cell region M and the peripheral circuit region P in the foregoing embodiment, the holes may be formed in different steps. More specifically, the lower hole 19a may be formed in the peripheral circuit region P after the hole H1 has been formed in the memory cell region M. Alternatively, the hole H1 may be formed in the memory cell region M after the lower hole 19a has been formed in the peripheral circuit region P.

Although the silicon nitride films 16 and 18 are simultaneously formed in the memory cell region M and the peripheral circuit region P in the foregoing embodiment, the films may be formed in different steps. More specifically, after the silicon nitride film 16 has been formed in one step, the silicon nitride film 18 may be formed in another step. Alternatively, after the silicon nitride film 18 has been formed in one step, the silicon nitride film 16 may be formed in another step.

The silicon nitride films 16 and 18 are made from the same material as the spacer insulating films formed on the inner wall surfaces of a plurality of holes H1 and 19 in the memory cell region M and the peripheral circuit region P in the foregoing embodiment. However, the silicon nitride films 16 and 18 may be made from different materials (for example, a silicon nitride film and a silicon oxide film).

The silicon nitride films 8 and 9 and silicon oxide films 14 and 15 are used as the first insulating films in the foregoing embodiment. However, these films may be made from the same material (for example, a silicon oxide film) or different materials. The silicon oxide films 14 and 15 are used as the interlayer insulating films and the silicon nitride films 16 and 18 are used as the spacer insulating films in the foregoing embodiment. The interlayer insulating films and spacer insulating films may be made from the same material (for example, a silicon oxide film) or different materials.

The upper hole 19b may be or may not be provided.

Although the invention is applied to a NAND flash memory in the foregoing embodiment, the invention may be applied to an EEPROM, EPROM, NOR flash memory, instead. Furthermore, the invention may be applied to another non-volatile semiconductor memory device, semiconductor memory device or semiconductor dev ice.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
   a semiconductor substrate divided into a memory cell region in which a memory cell is formed and a peripheral circuit region in which a peripheral circuit for driving the memory cell is formed;
   a plurality of conductive layers provided in each region so as to interpose an interlayer insulating film;
   a plurality of connection wiring layers formed in a plurality of holes which are formed in the interlayer insulating film so as to extend through the conductive layers of each region, the connection wiring layers electrically connecting the conductive layers; and
   a spacer insulating film functioning as a spacer which is formed on inner sidewall surfaces of the holes and outer sidewall surfaces of the connection wiring layers in each region.

2. The semiconductor device according to claim 1, wherein the spacer insulating film of the peripheral circuit region is made of an insulating film which is further made of the same material as of the spacer insulating film of the memory cell region.

3. The semiconductor device according to claim 1, wherein each hole of the peripheral circuit region includes a lower hole and an upper hole which is formed on the lower hole so as to have a larger diameter than the lower hole.

4. The semiconductor device according to claim 1, wherein the memory cell region includes a bit line contact forming region and the holes of the memory cell region are formed in the bit line contact forming region.

5. A semiconductor device comprising:
   a semiconductor substrate divided into a memory cell region in which a memory cell is formed and a peripheral circuit region in which a peripheral circuit for driving the memory cell is formed;
   a gate insulating film formed in each region on the semiconductor substrate;
   a plurality of gate electrodes formed on the gate insulating film of each region;
   a first insulating film formed between the gate electrodes of each region and on the gate electrodes;
   a first conductive layer formed between the adjacent gate electrodes so as to be located upper than an upper surface of the first insulating film in the memory cell region;
   a second conductive layer formed so as to be located between the gate electrodes adjacent to a surface side of the semiconductor substrate in the memory cell region;
   a plurality of first connection wiring layers formed in a plurality of first holes which are formed in the first insulating film so as to extend through the first and second conductive layers in the memory cell region respectively, the first connection wiring layers electrically connecting each of the first and second conductive layers to the other;
   a third conductive layer formed upper than an upper surface of the first insulating film of the peripheral circuit region so as to be located between the adjacent gate electrodes;
   a fourth conductive layer formed between the gate electrodes adjacent to a surface side of the semiconductor substrate in the peripheral circuit region;
   a plurality of second connection wiring layers formed in a plurality of second holes which are formed in the first insulating film so as to extend through the third and fourth conductive layers in the peripheral circuit region respectively, the second connection wiring layers electrically connecting each of the third and fourth conductive layers to the other;

a first spacer insulating film functioning as a spacer which is formed on inner sidewall surfaces of the second holes in the peripheral circuit region and outer sidewall surfaces of the first connection wiring layers; and a second spacer insulating film functioning as a spacer which is formed on inner sidewall surfaces of the second holes in the peripheral circuit region and inner sidewall surfaces of the second holes and outer sidewall surfaces of the second connection wiring layers.

6. The semiconductor device according to claim 5, wherein the spacer insulating film of the peripheral circuit region is made of an insulating film which is further made of the same material as of the spacer insulating film of the memory cell region.

7. The semiconductor device according to claim 5, wherein each hole of the peripheral circuit region includes a lower hole and an upper hole which is formed on the lower hole so as to have a larger diameter than the lower hole.

8. The semiconductor device according to claim 5, wherein the memory cell region includes a bit line contact forming region and the holes of the memory cell region are formed in the bit line contact forming region.

* * * * *